United States Patent [19]
Bennett et al.

[11] Patent Number: 5,420,057
[45] Date of Patent: May 30, 1995

[54] SIMPLIFIED CONTACT METHOD FOR HIGH DENSITY CMOS

[75] Inventors: Reid S. Bennett, Albuquerque, N. Mex.; Dennis S. Yee, Pleasantville, N.Y.

[73] Assignee: International Business Machines Corporation, Armonk, N.Y.

[21] Appl. No.: 269,856

[22] Filed: Jun. 30, 1994

[51] Int. Cl.⁶ .......................................... H01L 21/265
[52] U.S. Cl. .................................... 437/40; 437/41; 437/44; 437/984; 148/DIG. 141
[58] Field of Search ............... 437/40, 41, 44, 913, 437/984; 148/DIG. 141

[56] References Cited

U.S. PATENT DOCUMENTS

| | | | |
|---|---|---|---|
| 5,153,145 | 10/1992 | Lee et al. | 437/44 |
| 5,171,700 | 12/1992 | Zamanian | 437/40 |
| 5,200,357 | 4/1993 | Collot et al. | 437/41 |
| 5,229,326 | 7/1993 | Dennison et al. | 437/44 |
| 5,234,850 | 8/1993 | Liao | 437/44 |
| 5,244,823 | 9/1993 | Adan | 437/41 |
| 5,338,698 | 8/1994 | Subbanna | 437/40 |
| 5,364,804 | 11/1994 | Ho et al. | 437/41 |

FOREIGN PATENT DOCUMENTS 0179238  6/1992  Japan ........................................ 437/40

*Primary Examiner*—Brian E. Hearn
*Assistant Examiner*—Trung Dang

[57] ABSTRACT

A self-aligned method of forming contacts to a transistor gate, source and drain reduces the required spacing between the nominal center of the gate and electrode at little cost in process complexity by the provision of a sidewall positioned above the LDD-defining sidewall and extending above the top Of the gate by a buffer amount sufficient to protect the gate during the process of opening a source or drain contact.

6 Claims, 2 Drawing Sheets

SIMPLIFIED CONTACT METHOD FOR HIGH DENSITY CMOS

TECHNICAL FIELD

The field of the invention is that of MOS transistor fabrication.

BACKGROUND ART

As the density of MOS circuits increases, the requirements on alignment become more stringent. If a particular step, such as forming a contact from an upper interconnection level to a transistor is not self-aligned, then allowance in circuit layout must be made for alignment errors. Accumulation of tolerances defeats the goal of increasing the circuit density.

The art has used complex schemes, such as borderless contacts. Typically, an insulating sidewall is formed on the gate, so that the source/drain aperture may overlap the gate by some amount without causing a short. This achieves the desired result but at the price of considerable process complexity and expense.

The art has long felt the need for a simpler and less expensive process that achieves the high densities required by modern circuits.

SUMMARY OF THE INVENTION

The invention relates to a self-aligned method of forming contacts to a transistor gate, source and drain that reduces the required spacing between the nominal center of the gate and electrode at little cost in process complexity.

A feature of the invention is the provision of a sidewall positioned above the LDD-defining sidewall and extending above the top of the gate by a buffer amount sufficient to protect the gate during the process of opening a source or drain contact.

BEST MODE OF CARRYING OUT THE INVENTION

Figure 2:
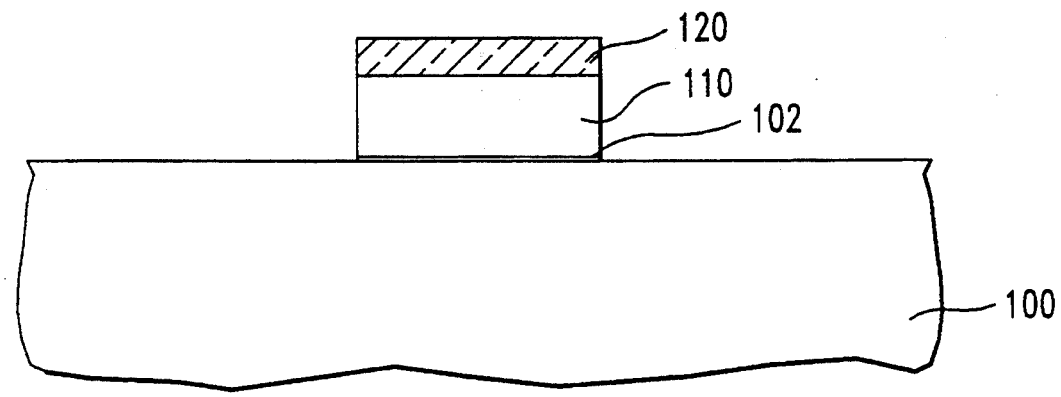
FIGS. 2–4 show intermediate steps in the construction of a transistor.

FIG. 2 shows in cross section a portion of an integrated circuit with a single-crystal substrate 100, above which a gate stack comprising layers of gate oxide 102, polycrystalline silicon (poly) 110, and 150 nm of a sacrificial film that may be TEOS (tetra-ethyl-ortho-silicate) or silicon-doped boron nitride 120 have been deposited and then patterned in a conventional reactive ion etch (RIE) to form a structure that will become the gate for a MOS transistor. Film 120 is a temporary layer that provides support for the formation of a nitride sidewall that will protect the top corners of poly gate 110 when source and drain contacts are opened.

Figure 3:
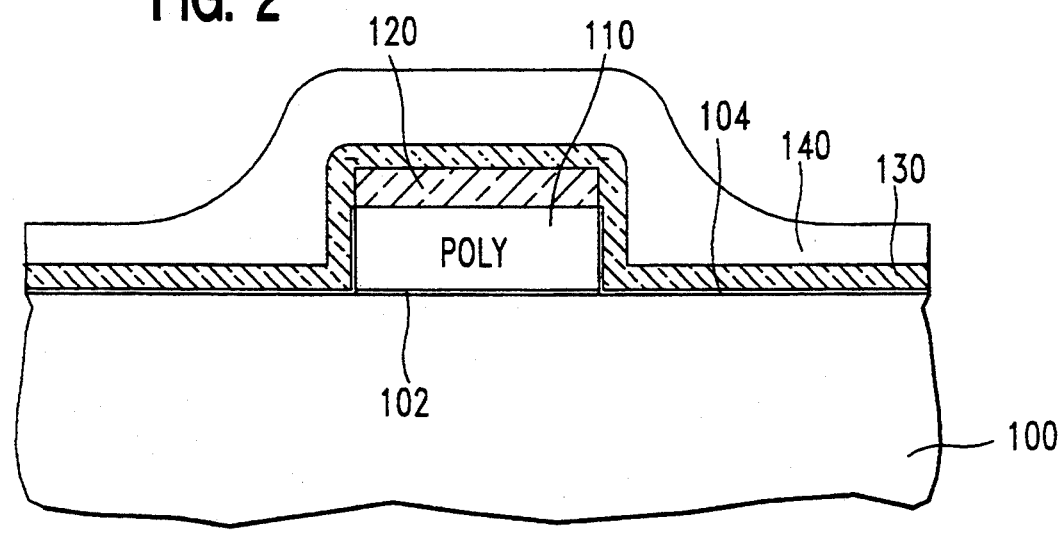
Figure 4:
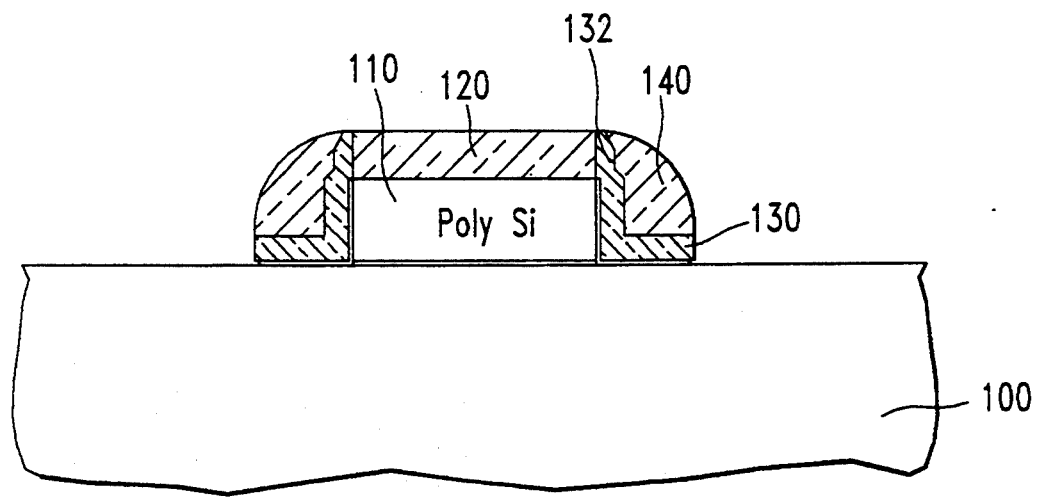

FIG. 3 shows the same area after thermal oxidation of the sidewalls of poly 110 to form oxide ($SiO_2$) layer 104 and the conventional deposition of a conformal layer of nitride ($Si_3N_4$) 130, above which a layer of TEOS 140 has been deposited. Illustratively, film 140 is 150 nm thick for a poly layer thickness of 200 nm. The structure is then RIE'd with a timed or end point etch to remove TEOS 140 and nitride 130 where it is horizontal, stopping on silicon outside the gate stack and 110 leaving nitride and oxide sidewalls as shown in FIG. 4. If some of film 120 is removed during a conventional overetch it does not matter because film 120 will later be removed. The result of this process is that a nitride stub 132 remains above the top of gate 110 and a horizontal portion of nitride 130 remains underneath a wide sidewall remaining from TEOS layer 140.

The remaining portions of films 140 and 120 are removed in a conventional HF solution (or hot phosphoric acid), after which sources, drains and poly 110 are implanted. Ti is deposited and annealed to form Ti Salicide 112 and 114 in order to reduce contact resistance. A conformal layer of nitride 150 (illustratively 150 nm) is deposited, leaving the structure shown in FIG. 1.

Figure 1:
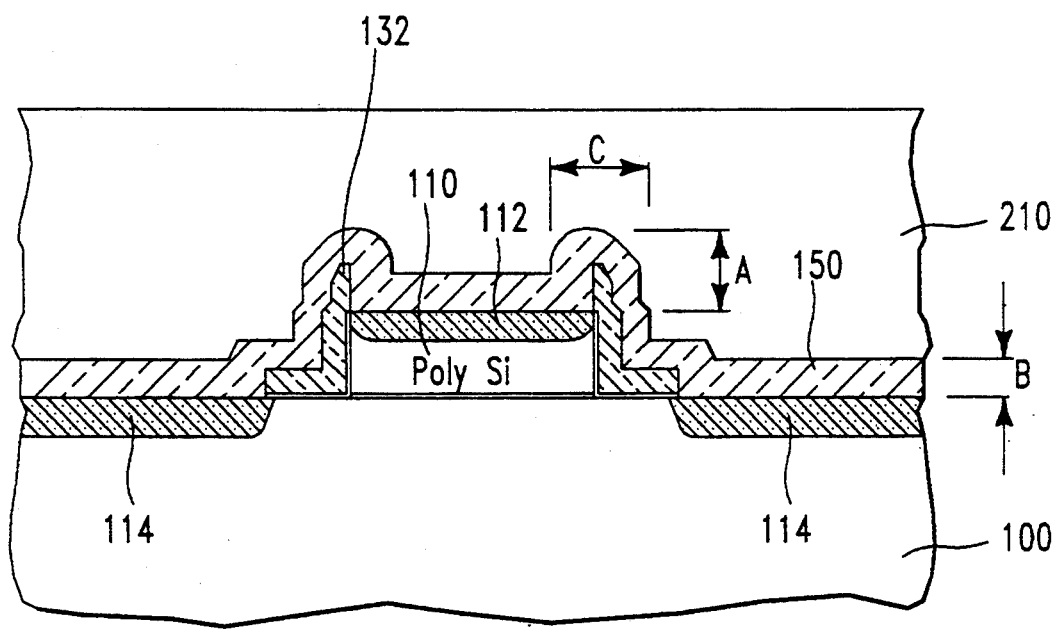
FIG. 1 shows a cross section of a transistor constructed according to the invention before the opening of contact holes.

It is evident in FIG. 1 that there is a protective sidewall above the corners of gate 110 having a height above the top of poly 110 that is denoted by the letter A and is nominally the sum of the thickness B of nitride 150 and the thickness of film 120. This sidewall is aligned about stub 132 of nitride 130 that was defined by the removal of film 120. A layer of dielectric 210 (1000 nm of PSG) is deposited and planarized. Contact apertures will be etched through dielectric 210 by RIE through layer 210, stopping on nitride 150 and a second RIE through nitride 150, stopping on silicon.

With this self-aligned sidewall buffer, there is provided an alignment tolerance denoted by the letter C, extending from the nominal position of the left edge of the drain contact to a point on top of poly 110 where the nitride removal etch that will open up a contact hole through the horizontal layer of nitride 150 above the drain will also penetrate through the nitride on top of poly 110.

Figure 5:
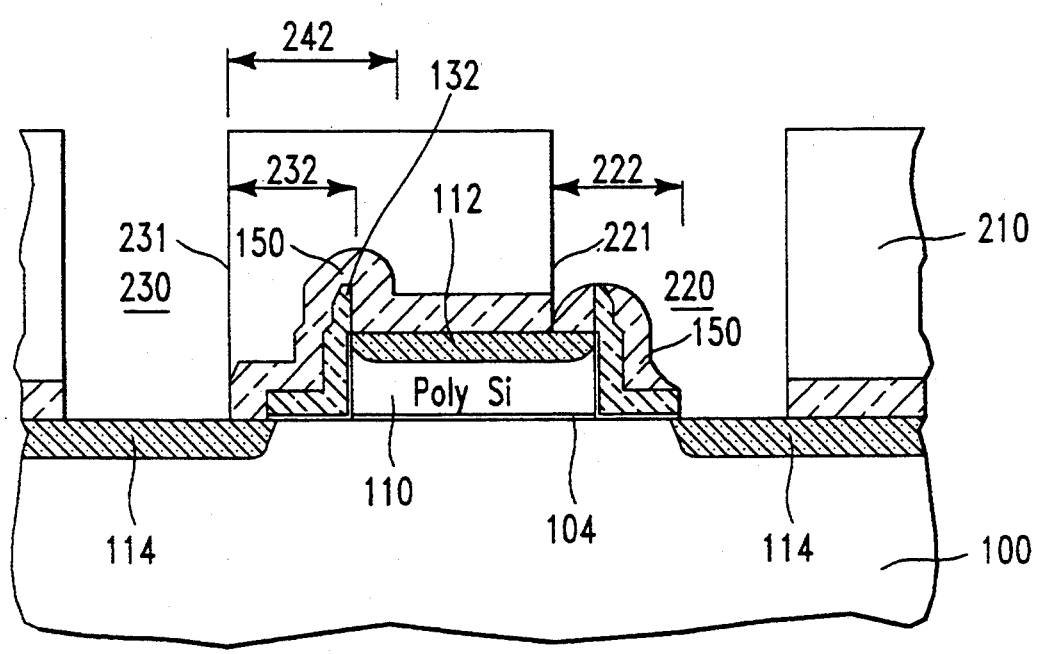
FIG. 5 shows the transistor with aligned and misaligned contact apertures.

FIG. 5 illustrates two apertures, one correctly aligned (230) and the other (220) misaligned by the maximum amount. The arrow labelled 232 denotes a nominal separation distance between the closer edge 231 of aperture 230 and the vertical edge of nitride alignment stub 132. On the right of the figure, there is shown aperture 220 having the maximum amount of misalignment, denoted by the arrow labelled 222. If aperture 220 is any closer to the gate than is shown in the drawing, the contact that will be deposited in aperture 220 will cause a short between the drain and the gate. The extra tolerance provided by the invention is defined by the difference between arrow 242, indicating the distance from the nominal aperture edge to the point where the nitride etch cuts through to reach salicide 112 on top of poly 110 and the arrow 232, indicating the previous tolerance.

Not shown in the drawing, a contact to the gate is defined and etched using the same mask and etch steps. It is placed outside the plane of the paper, either in front or behind, in order to provide tolerance from the source and drain contacts illustrated here.

Those skilled in the art will readily appreciate that the invention can be practiced with either P-type or N-type MOS transistors and with either bulk or silicon on insulator (SOI) substrates. it will also be appreciated that there are many steps in integrated circuit processing and the phrase "preparing the substrate" will be used to indicate preliminary steps of growing an epitaxial layer, performing a threshold implant, forming n- and/or p-wells, etc. and the phrase "completing the circuit" will be used to indicate back end of the line steps of forming interconnects, interlayer dielectrics, etc. Those skilled in the art will readily be able to devise modifications of the invention in the light of the disclosure and the following claims are not intended to be limited to the embodiment disclosed.

We claim:

1. A method of forming an LDD transistor in a silicon layer comprising the steps of:

preparing a silicon substrate;

forming a gate stack comprising a gate oxide, a gate electrode layer having a gate top surface and a first sacrificial dielectric;

patterning said gate stack to define a gate stack column having vertical sidewalls and source and drain regions in said silicon layer adjoining said gate stack column;

oxidizing said vertical sidewalls;

depositing a conformal etch resistant dielectric over said gate stack column and said source and drain areas;

depositing a second sacrificial dielectric over said conformal dielectric in said gate stack column and said source and drain areas;

directionally etching horizontal portions of said second sacrificial dielectric and said conformal dielectric, thereby exposing said first sacrificial dielectric and said source and drain areas and leaving first gate sidewalls including at least said conformal dielectric;

removing said first sacrificial dielectric, leaving vertical alignment stubs of said conformal dielectric adjacent extending from said first gate sidewalls above said gate top surface;

depositing a protective conformal dielectric having a nominal contact cover thickness above said gate stack column, thereby forming self-aligned protective members about each of said vertical alignment stubs and having a thickness greater than said nominal contact cover thickness;

depositing a first interlayer dielectric;

etching contact holes above said source and drain regions through said interlayer dielectric and through said protective conformal dielectric to said source and drain regions, whereby a residual thickness of said protective conformal dielectric remains above corners of said gate stack column; and completing said integrated circuit.

2. A method according to claim 1, in which said first sacrificial dielectric is TEOS.

3. A method according to claim 1, in which said first sacrificial dielectric is boron nitride.

4. A method according to claim 1, further including a step of etching a contact hole above said gate through said protective conformal dielectric to said gate.

5. A method according to claim 4, in which said first sacrificial dielectric is TEOS.

6. A method according to claim 4, in which said first sacrificial dielectric is boron nitride.

* * * * *